Oct. 20, 1959 A. K. JENSEN 2,909,678

TRANSISTOR CONTROL CIRCUITS

Filed June 11, 1956

INVENTOR
A. K. JENSEN
BY Alan C. Rose
ATTORNEY

United States Patent Office 2,909,678

Patented Oct. 20, 1959

2,909,678

TRANSISTOR CONTROL CIRCUITS

Alan K. Jensen, Kenvil, N.J., assignor to Bell Telephone Laboratories, Incorporated, New York, N.Y., a corporation of New York Application June 11, 1956, Serial No. 590,553

7 Claims. (Cl. 307—88.5)

This invention relates to transistor control circuits, and more specifically to improved transistor control arrangements for bistable transistor circuits.

In the binary computer field, a technology has been developed in which only transistors and resistors need be employed. This technology is termed "Direct Coupled Transistor Logic" circuitry, and is often abbreviated to the initials "D.C.T.L.". The transistors in such circuits characteristically are arranged in circuit configurations with all or most of the emitters connected to a common point such as ground, and each transistor normally has its base connected to the collector of the preceding transistor. The characteristics of the transistors employed in D.C.T.L. circuits are such that they are de-energized when the base input circuit is grounded, or even when the base is brought close to ground potential. In addition, when the transistors are energized, the collector-to-emitter impedance is so low that the voltage at the collector is reduced almost to the ground potential of the emitter. Therefore, when one transistor is energized, the transistor or transistors coupled to it in the manner noted above are turned off. Similarly, when a transistor is de-energized, the transistors coupled to it are energized. Other details involved in the fundamental D.C.T.L. circuits are disclosed in an article by R. H. Beter et al. which appeared at pages 139 through 145 of part 4 of the 1955 Institute of Radio Engineers Convention Record.

Within the context of the D.C.T.L. circuit technology in which only resistors and transistors are employed, various methods for instrumenting counter circuits have been proposed. In accordance with known principles, each stage of a binary counter requires a bistable device which changes state when an input pulse is applied thereto. In addition, control circuits including some short term delay are required to insure reversal of the state of the bistable device upon the application of pulses. To accomplish these functions, the use of two bistable multivibrators for each counter stage was proposed. However, these circuits had the obvious disadvantage of employing too many circuit components. It was also suggested that capacitors be employed to provide the necessary short term storage, but the use of capacitors violated the basic restriction of D.C.T.L. circuits to resistor and transistor components.

Accordingly, an important object of the present invention is the improvement and simplification of control circuits for bistable direct coupled transistor logic circuits using only resistors and transistors.

Another object of the invention is the improvement of transistor delay circuitry.

In accordance with the invention, these objects are accomplished by connecting transistors which are arranged to operate slowly in the circuit interconnecting the bistable transistor circuit per se with its input control circuitry. The delay in operation of the transistors provides the short term delay required to insure appropriate routing of the input signals to change the state of the bistable transistor circuit. In addition, successive stages of the bistable circuits and associated control circuitry may be cascaded to form a binary counter.

The transistor delay circuits per se constitute another feature of the invention. In these circuits, three factors are employed in combination to significantly delay the de-energization of one transistor with respect to another. The first factor is the increased collector resistance of the slow (to de-energize) transistor with respect to the fast (to de-energize) transistor, which reduces the collector current and therefore increases the saturation of the slow transistor. The second factor is the lower resistance in the base-to-emitter biasing circuit of the slow transistor with respect to that of the fast transistor. This increases the relative base-to-emitter current of the slow transistor, and further increases its saturation with respect to the fast transistor. A particularly effective circuit for instrumenting the biasing circuit is the connection of the voltage source through a resistor to the base of the slow transistor with an additional resistor connected from the base of the slow transistor to the base of the fast transistor. Then, when a de-energizing control signal is applied to the base of the fast transistor, the additional resistor located in the base discharge path of the slow transistor further reduces its speed of de-energization.

Other objects and various features and advantages of the invention may be readily apprehended from the following detailed description taken in conjunction with the accompanying drawings, and from the appended claims.

Figure 1:
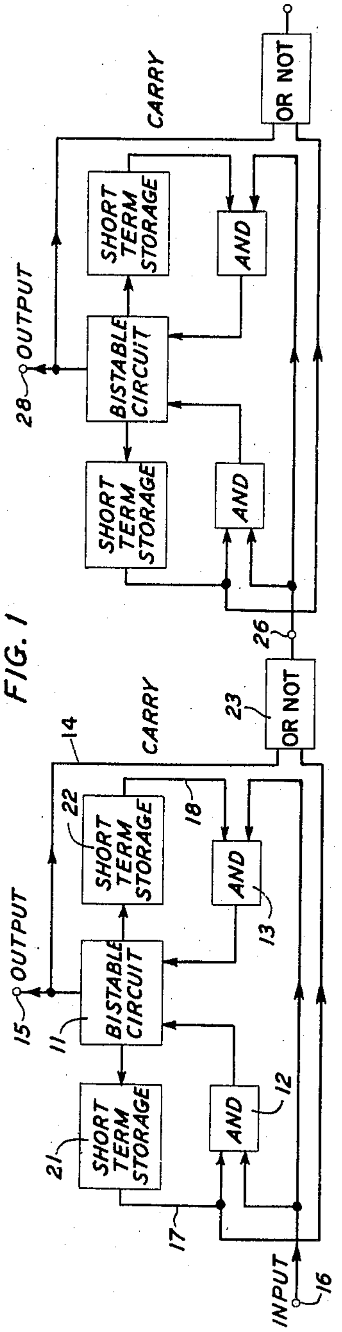
Fig. 1 is a block diagram of two stages of a multistage counter circuit.

With reference to the drawings, Fig. 1 shows two stages of a binary counter. Referring to the first stage in Fig. 1, it includes a bistable circuit 11 and a control circuit including the two And circuits 12 and 13 for changing its state. The bistable circuit 11 may, for example, be a multivibrator having two stable conditions of equilibrium. When a pulse is applied to the circuit 11 from the And unit 12, it assumes one state, while an output pulse from the And unit 13 shifts it to the opposite state. The output circuit 15 is connected to one of the two active elements in the multivibrator.

For purposes of analysis, it is convenient to represent the two states of each binary counter stage by the symbols "0" and "1." For example, when the output terminal 15 is at ground potential, the counter stage is in the "0" state, and when the output terminal 15 is positive, the counter stage is in the "1" state.

Input pulses from the terminal 16 are routed through And circuit 12 or And circuit 13, in accordance with the state of the bistable circuit 11. Depending on the state of circuit 11, either input lead 17 to And unit 12 or input lead 18 to And unit 13 is energized. Assuming, for example, that the output circuit 15 is in the "1" state, lead 18 to And unit 13 is energized. Under these circumstances, input pulses applied at terminal 16 are routed through the And unit 13 to change the circuit 11 to the "0" state. The short term storage unit 21 is provided to delay the energization of lead 17, and thus preclude the gating of the input pulse through the And unit 12 when the bistable circuit 11 is being switched by a pulse through And unit 13. Similarly, the short term storage unit 22 is employed to delay the energization of lead 18 when a pulse is being applied to the bistable circuit 11 through the And unit 12.

An Or-Not unit 23 (i.e. a unit which provides a "1" signal on an output lead thereof only when a "0" is coupled to every one of its input leads) directs a carry pulse to an input terminal 26 of the next higher order or right-hand stage of the binary counter of Fig. 1 whenever the output terminal 15 of the preceding or left-hand stage undergoes a "1" to "0" transition. More specifically, assume that a pulse is applied to the input terminal 16 and that the bistable circuit 11 is thereby switched from the "1" to the "0" state. A "0" signal is then coupled by means of a lead 14 from the output terminal 15 to one input of the Or-Not unit 23. At that same time a "0" is coupled by means of the leads 17 and 19 to the other input of the Or-Not unit 23, for, as explained above, the short term storage unit 21 delays the coupling of a "1" to the lead 17 when a pulse is applied to the input terminal 16. The respective application of two "0's" to the two inputs of the Or-Not unit 23 results in the appearance of a carry pulse, i.e. a "1" signal, on the output lead of the Or-Not unit 23 and therefore at the input terminal 26 of the next higher order stage, the duration of the carry pulse being controlled by the length of the delay introduced by the short term storage unit 21 and being about of the duration of the input pulse.

The counter shown in Fig. 1 counts in an increasing manner, with the count being incremented by one in response to each input pulse. Thus, for example, if the output terminal 15 indicates that the first counter stage is in the "1" state and output terminal 28 indicates that the second stage is in the "0" state, the next pulse applied to the input terminal 16 will change the state of each stage. This is equivalent to changing the output of the counter from the binary number 01 to the binary number 10, of which the corresponding decimal numbers are 1 and 2. Many additional counting stages may of course be provided.

Figure 2:
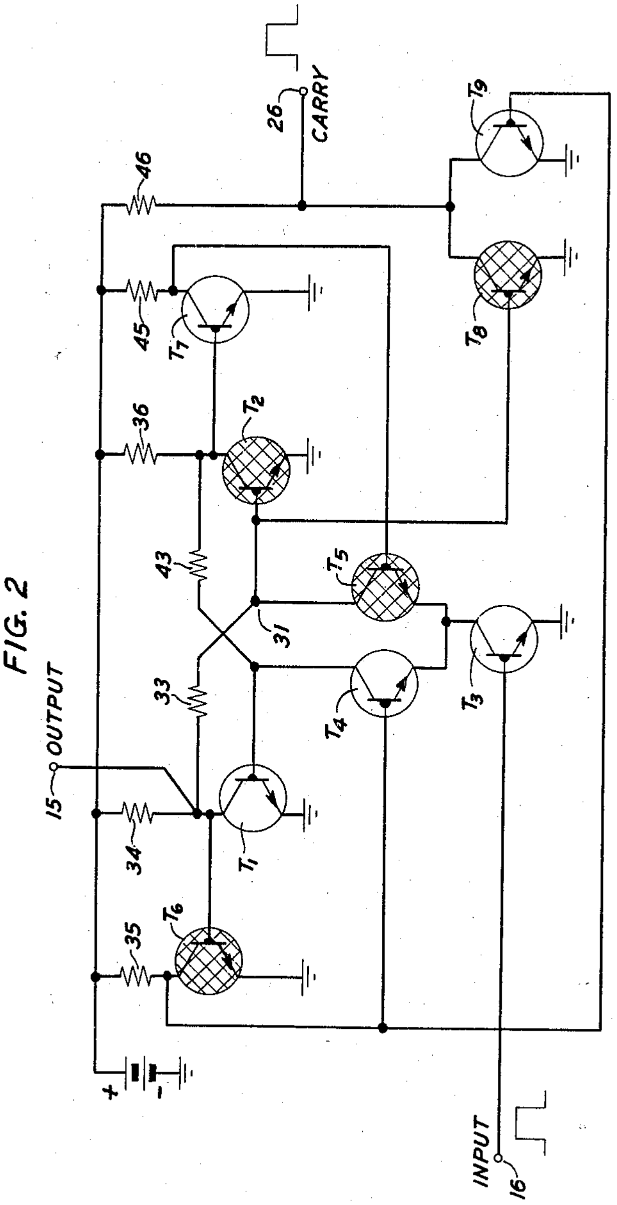
Fig. 2 is a schematic circuit diagram of a bistable circuit and associated control circuitry in accordance with the invention which may form one stage of the circuit of Fig. 1.

The circuit of Fig. 2 corresponds to one stage of the counter circuit shown in Fig. 1. In Fig. 2, the transistors $T_1$ and $T_2$ are the active elements of a direct coupled multivibrator. They therefore correspond to the bistable circuit 11 of Fig. 1. The three transistors $T_3$, $T_4$, and $T_5$ make up a composite circuit which performs the function of the two And units 12 and 13 of Fig. 1. The transistors $T_6$ and $T_7$ in Fig. 2 are the critical elements of the delay circuits 21 and 22, respectively, of Fig. 1. The Or-Not circuit 23 of Fig. 1 in the carry circuit finds its counterpart in the transistors $T_8$ and $T_9$ of Fig. 2. As indicated symbolically, all the transistors are of the NPN type.

In Fig. 2, the transistors which are energized are indicated by cross-hatching lines. This is the "1" state of the counter stage, as mentioned above, in which output terminal 15 is at a positive voltage because of the de-energization of transistor $T_1$. Following the application of a pulse at input terminal 16, the transistor $T_1$ is energized and the voltage at output terminal 15 drops nearly to ground potential.

Considering the response of the counter stage in detail, in the absence of input pulses the input terminal 16 to the base of transistor $T_3$ is held at ground potential. Positive pulses applied at terminal 16 energize transistor $T_3$. Assuming that the transistors $T_2$, $T_5$, $T_6$, and $T_8$ which have cross-hatching lines are energized, the energization of transistor $T_3$ has the effect of grounding point 31, which is connected to the base of transistor $T_2$. This operation de-energizes transistor $T_2$. The transistor $T_1$ which has been maintained in the de-energized condition by the energization of transistor $T_2$ now becomes energized. The state of the multivibrator comprising transistors $T_1$ and $T_2$ is therefore reversed.

In order to permit the full de-energization of transistor $T_2$, it is desired that the control transistors $T_4$ and $T_5$ maintain their normal conditions of energization or de-energization for a brief additional period. Appropriate delay is accomplished through the use of the additional transistors $T_6$ and $T_7$. Specifically, in the example shown in Fig. 2, it is necessary that the transistor $T_6$ be delayed in its de-energization as compared with the de-energization of transistor $T_2$. When both $T_3$ and $T_5$ are energized, point 31 is effectively grounded. This will eventually de-energize both transistors $T_2$ and $T_6$. Several factors are employed cumulatively to substantially delay the de-energization of transistor $T_6$, as compared with transistor $T_2$. First, the resistor 33 in the base discharge path of transistor $T_6$ tends to slow down its de-energization. Secondly, the de-energization time of a transistor is generally proportional to its saturation, and saturation varies directly with base current. The base current for transistors $T_2$ and $T_6$ is supplied through resistor 34. In the case of transistor $T_2$, however, the base current is reduced by the presence of the additional resistor 33. The reduced base current of $T_2$ as compared with $T_6$, therefore, constitutes a second factor which increases the speed of operation of transistor $T_2$ with respect to $T_6$.

The saturation and therefore the speed of de-energization of transistors is also inversely proportional to the collector current. Thus, the resistor 35 supplying collector current to transistor $T_6$ may, for example, have many times the resistance of the resistor 36 supplying collector current to transistor $T_2$. The reduced collector current of transistor $T_6$ increases its saturation and further reduces its de-energization time with respect to transistor $T_2$.

For all of the reasons set forth in the preceding paragraphs, the transistor $T_6$ is considerably delayed in its de-energization with respect to transistor $T_2$. The time required for the de-energization of transistor $T_6$ is somewhat longer than the duration of an input pulse. After the termination of the input pulse, however, transistor $T_6$ become de-energized, and transistor $T_4$ is energized. This action sets the stage for the operation of the next succeeding input pulse which will turn the multivibrator back to the energization state shown in Fig. 2.

When the counter stage is in the "0" state, the transistors $T_2$, $T_5$, $T_6$, and $T_8$ which have cross-hatching, and the transistors $T_3$ and $T_9$ are all de-energized, and only transistors $T_1$, $T_4$, and $T_7$ are energized. When the next pulse is received at input terminal 16, transistor $T_3$ is energized. This starts a control operation which is equivalent to that described in the preceding paragraphs, and which eventually results in the energization state shown in Fig. 2. In this operation, the resistors 43 and 45 serve the same functions as resistors 33 and 35, respectively, in the operation described above, and are of the same values.

A "carry" pulse is supplied on lead 26 to the next stage each time the multivibrator has been in the "1" state and is in the process of switching to the "0" state. In the previous description, it has been assumed that the indicated state with transistor $T_2$ energized and transistor $T_1$ de-energized is the "1" state. The carry pulse to the next stage is a positive pulse having substantially the same pulse width as the pulse shown at input terminal 16.

The transistors $T_8$ and $T_9$ are employed to produce the carry pulse. Collector current is supplied to these transistors through the resistor 46. When transistor $T_1$ is in the de-energized state, transistor $T_8$ is supplied with base current through resistors 33 and 34 and is therefore energized. This holds point 26 at ground potential. When an input pulse energizes transistor $T_3$, the point 31 drops to ground potential, and the collector circuit of transistor $T_8$ is open-circuited. Output terminal 26 then assumes a positive potential. After a significant delay, transistor $T_6$ is de-energized, and this in turn energizes transistor $T_9$, terminating the carry pulse by effectively grounding terminal 26.

Concerning the parameters of the circuit of Fig. 2, the transistors may be either junction or surface barrier type transistors. In addition, PNP transistors could be used in place of the NPN transistors shown in Fig. 2 if the polarity of the voltage source and the applied pulses were reversed. Suitable transistors are Western Electric type GA 52609 (NPN alloy junction), the Raytheon CK 761 (PNP alloy junction), or General Electric 4JD 1A–20 (PNP alloy junction). Each of the circuits is operative over a wide range of supply voltages; for example, voltages from one-half volt to twelve volts may be employed. This wide variation is possible because the critical ratio of base current to collector current remains substantially the same. When a two volt supply is employed, suitable values for the resistors in Fig. 2 are as follows:

| | Ohms |
|---|---|
| Resistor 33 | 51 |
| Resistor 34 | 430 |
| Resistor 35 | 4,000 |
| Resistor 36 | 430 |
| Resistor 43 | 51 |
| Resistor 45 | 4,000 |
| Resistor 46 | 4,000 |

The foregoing specific transistor types and values of resistance are not critical, and are given merely to illustrate one workable set of components which may be employed.

It is to be understood that the above-described arrangements are illustrative of the application of the principles of the invention. Numerous other arrangements may be devised by those skilled in the art without departing from the spirit and scope of the invention.

What is claimed is:

1. In a counter stage for direct coupled transistor logic circuitry, a bistable circuit including first and second transistors in a common emitter circuit configuration and having their bases and collectors conductively cross-connected, a source of input pulses, a gating circuit for applying said input pulses to the base of only one of said transistors, and circuit means for controlling said gating circuit in accordance with the state of said bistable circuit before the arrival of each input pulse, said circuit means including third and fourth transistors connected from the collector of said first and second transistors, respectively, to said gating circuit and also including means for retarding the operation of said third and fourth transistors.

2. In combination, a first transistor which is slow to de-energize and a second transistor which is fast in its de-energization, said transistors being in the common emitter circuit configuration, a source of voltage, resistance means having a preassigned magnitude interconnecting said voltage source and the collector of said slow transistor, resistance means of a significantly lesser magnitude interconnecting said voltage source and the collector of said fast transistor, circuit means including resistance interconnecting said voltage source and the base of said slow transistor for supplying base-to-emitter biasing current to said slow transistor, circuit means including additional resistance connected from the base of said slow transistor to the base of said fast transistor to provide a lesser amount of biasing current to said fast transistor, switching means for selectively changing the potential at the base of said fast transistor substantially to ground potential to de-energize both of said transistors, a first output circuit, a second circuit requiring signals which are staggered in time with respect to signals applied to said first output circuit, and means for coupling signals from said first and second transistors to said first and second circuits.

3. In combination, a bistable transistor multivibrator circuit including two transistors having their bases and collectors conductively cross-connected, a resistor included in each of said cross-connections, a first And circuit connected to apply signals to one of the cross-connections, a second And circuit connected to apply signals to the other of the cross-connections, means for applying control pulses to one input of each of said And circuits, a third transistor having its base connected to one of said transistors and its collector connected to another input of said first And unit, and a fourth transistor having its base connected to the other of said transistors and its collector connected to the other input of said second And unit.

4. In a counter stage for direct coupled transistor logic circuitry, a bistable circuit including first and second transistors in common emitter circuit configuration and having their bases and collectors conductively cross-connected, a resistor included in each of said cross-connections, a source of input pulses, a gating circuit for applying said input pulses to the base of only one of said transistors, and circuit means for controlling said gating circuit in accordance with the state of said bistable circuit before the arrival of each input pulse, said circuit means including third and fourth transistors from the collector of said first and second transistors, respectively, to said gating circuit and also including means for reducing the collector current of said third and fourth transistors with respect to said first and second transistors.

5. In a counter stage for direct coupled transistor logic circuitry, a bistable circuit including first and second transistors in common emitter circuit configuration and having their bases and collectors conductively cross-connected, a resistor included in each of said cross-connections, a source of input pulses, a gating circuit for applying said input pulses to the base of only one of said transistors, circuit means for controlling said gating circuit in accordance with the state of said bistable circuit before the arrival of each input pulse, said circuit means including third and fourth transistors from the collector of said first and second transistors, respectively, to said gating circuit and also including means for reducing the collector current of said third and fourth transistors with respect to said first and second transistors, and a carry circuit including fifth and sixth transistors having their collectors connected together, the base of said fifth transistor being connected to receive enabling signals from said bistable circuit, the base of said sixth transistor being connected to said source of input pulses.

6. In combination, a bistable transistor multivibrator circuit including two transistors having their bases and collectors conductively cross-connected, a first And circuit connected to apply signals to one of the cross-connections, a second And circuit connected to apply signals to the other of the cross-connections, means for applying control pulses to one input of each of said And circuits, a third transistor having its base connected to one of said transistors and its collector connected to another input of said first And unit, and a fourth transistor having its base connected to the other of said transistors and its collector connected to the other input of said second And unit.

7. A direct coupled transistor logic circuit comprising a first transistor, a second transistor, a source of voltage, means for supplying a predetermined amount of collector current to said first transistor from said voltage source, means for supplying a significantly greater amount of collector current to said second transistor, circuit means including resistance interconnecting said voltage source and the base of said first transistor for supplying base-to-emitter biasing current to said transistor, circuit means including additional resistance connected from the base of said first transistor to the base of said second transistor to provide a lesser amount of biasing current to the base-to-emitter circuit of said second transistor, switching means for selectively changing the potential at the base of said second transistor substantially to ground potential to de-energize both of said transistors, a first output circuit, a second circuit requiring signals which are staggered in time with respect to signals applied to said first output circuit, and means for coupling signals from said first and second transistors to said first and second circuits.

References Cited in the file of this patent

UNITED STATES PATENTS 2,651,728 Wood ---------------- Sept. 8, 1953

OTHER REFERENCES

Ralph H. Beter et al.: Publication Electronics, June 1955, pages 132–136.